United States Patent
Drerup

(10) Patent No.: US 8,266,386 B2
(45) Date of Patent: *Sep. 11, 2012

(54) STRUCTURE FOR MAINTAINING MEMORY DATA INTEGRITY IN A PROCESSOR INTEGRATED CIRCUIT USING CACHE COHERENCY PROTOCOLS

(75) Inventor: Bernard Charles Drerup, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 842 days.

This patent is subject to a terminal disclaimer.

(21) Appl. No.: 12/277,297

(22) Filed: Nov. 25, 2008

(65) Prior Publication Data

US 2009/0112563 A1    Apr. 30, 2009

Related U.S. Application Data

(63) Continuation-in-part of application No. 11/928,547, filed on Oct. 30, 2007.

(51) Int. Cl.
*G06F 12/00* (2006.01)
*G06F 13/00* (2006.01)
*G06F 13/28* (2006.01)

(52) U.S. Cl. ........ 711/141; 711/142; 711/143; 711/144; 711/145; 711/146

(58) Field of Classification Search .................. None
See application file for complete search history.

(56) References Cited

U.S. PATENT DOCUMENTS 5,905,876 A    5/1999 Pawlowski
6,209,123 B1*  3/2001 Maziasz et al. ............... 716/123
6,341,337 B1   1/2002 Pong
6,349,367 B1*  2/2002 Arimilli et al. ............... 711/143
6,405,289 B1   6/2002 Arimilli (Continued)

FOREIGN PATENT DOCUMENTS

EP    0510821 A1   10/1992

OTHER PUBLICATIONS

Belloum—"Maintaining Web Cache Coherency"—Dept Computer Science University Amsterdam (Oct. 2000).
Shen—"An Adaptive Cache Coherence Protocol for Distributed Shared-Memory Systems"—Computer Science and AI Lab MIT (Jan. 1999).

(Continued)

*Primary Examiner* — Yaima Campos
(74) *Attorney, Agent, or Firm* — Matt Talpis; Mark P Kahler

(57) ABSTRACT

A design structure for a processor system may be embodied in a machine readable medium for designing, manufacturing or testing a processor integrated circuit. The design structure may embody a processor integrated circuit including multiple processors with respective processor cache memories. The design structure may specify enhanced cache coherency protocols to achieve cache memory integrity in a multi-processor environment. The design structure may describe a processor bus controller manages cache coherency bus interfaces to master devices and slave devices. The design structure may also describe a master I/O device controller and a slave I/O device controller that couple directly to the processor bus controller while system memory couples to the processor bus controller via a memory controller. In one embodiment, the design structure may specify that the processor bus controller blocks partial responses that it receives from all devices except the slave I/O device from being included in a combined response that the processor bus controller sends over the cache coherency buses.

30 Claims, 5 Drawing Sheets

U.S. PATENT DOCUMENTS

| | | |
|---|---|---|
| 2002/0073281 A1 | 6/2002 | Gaither |
| 2002/0087801 A1 | 7/2002 | Bogin |
| 2004/0003184 A1* | 1/2004 | Safranek et al. ............... 711/146 |
| 2004/0044877 A1* | 3/2004 | Myers ............................ 712/11 |
| 2006/0190662 A1 | 8/2006 | Ogilvie |
| 2006/0236037 A1 | 10/2006 | Guthrie |

OTHER PUBLICATIONS

Reisner—"A Cache Coherency Protocol for Optically Connected Parallel Computer Systems"—IEEE (1996).

Terasawa—"A Cache Coherency Protocol for Multiprocessor Chip"—IEEE — (Jan. 18, 1995).

Dolenc—"PCI Bridge White Paper", Open Cores (Jun. 29, 2001).

* cited by examiner

CACHE COHERENCY
PROTOCOL METHOD

STRUCTURE FOR MAINTAINING MEMORY DATA INTEGRITY IN A PROCESSOR INTEGRATED CIRCUIT USING CACHE COHERENCY PROTOCOLS

CROSS REFERENCE TO RELATED PATENT APPLICATIONS

This patent application is a continuation-in-part of, and claims priority to, the U.S. patent application entitled "Method and Apparatus for Maintaining Memory Data Integrity in an Information Handling System Using Cache Coherency Protocols", inventor Bernard Drerup., Ser. No. 11/928,547, filed Oct. 30, 2007, that is assigned to the same Assignee as the subject patent application, the disclosure of which is incorporated herein by reference in its entirety.

TECHNICAL FIELD OF THE INVENTION

The disclosures herein relate generally to information handling systems, and more particularly, to cache coherency protocols in multi-tasking and multi-processor systems.

BACKGROUND

An information handling system (IHS) may include multiple processors for processing, handling, communicating or otherwise manipulating information. Each processor may itself include multiple processor cores that work together to process information. A processor or processor core may include processor functional units such as a stack pointer, a program counter, a fetch and decode unit, an issue and execute unit, register files, and other processor units. The processor may further include one or more caches or cache memories for storing information for access by the processor or processor core during normal memory load and store operations. A system memory may be accessible by multiple processors within the IHS. A processor or other cache may store data information local to each processor to provide faster access to copies of memory data such as system memory data.

A cache is a storage mechanism that provides local duplication of memory data values that an IHS stores in other locations such as system memory, register files, or other storage locations. For example, a processor or processor core may employ a local or nearby cache memory for fast access to memory data values. More simply put, the cache is a temporary storage area where data resides that processors or other devices may frequently access.

Caches increase the performance of software applications that frequently access the same data locations in system memory. System memory typically employs dynamic random access memory (DRAM). Cache memory typically employs static random access memory (SRAM) that is generally much faster than DRAM. Thus, memory accesses to cache memory are usually much faster than memory accesses to system memory.

When a device such as a processor desires access to a particular memory data value, it first checks the cache memories within the IHS for the same data value. If the processor finds a cache entry with a tag, or address identifier, that matches the particular desired memory data value, then the processor accesses that particular memory data value in the fast cache memory instead of the slower system memory. A cache data value found condition represents a "cache hit". For example, a web browser program may execute in a particular processor of an IHS. The particular processor may check local cache memory in an attempt to find a copy of the contents of a web page of a particular universal resource locator (URL) that the web browser program requests. In this example, the URL is the tag, and the contents of the web page are the memory data. A cache hit occurs when the processor finds the requested web page data in cache memory.

Alternatively, if the particular processor does not find the requested web page data in a local cache memory, the result is a "cache miss". Often the data that the particular processor requests will be part of the cache the next time the particular processor requests that same data. One type of cache is a "write-back" cache. A write-back cache may hold the most recent value of a memory location without immediately sending the same data to system memory. A processor may write data to a write-back cache before the processor initiates a write of that same data to the system memory or other backup memory location. In a write-back cache, the processor may perform multiple writes with different data each time. The processor may also read from the write-back cache multiple times before the write-back cache initiates a write to system or backup memory.

Caches achieve a reduction in overall memory processing time by allowing previously read data from system memory, or other data that processors write, to be readily available to processors during memory read and write operations. If data is available in a cache within the IHS, processors can access this cache rather than accessing slower system memory. As multiple caches become available within an IHS, multiple caches may store multiple copies of the same system memory data. As the size, count, and complexity of cache memories increase, the complexity of managing conflicts among duplicate copies of memory data also increases.

What is needed is a design structure for a processor integrated circuit that addresses the problems associated with managing multiple cache memories in a multi-tasking and multi-processor IHS environment as described above.

SUMMARY

Accordingly, in one embodiment, a design structure embodied in a machine readable medium for designing, manufacturing, or testing a processor integrated circuit, is disclosed. The design structure includes a plurality of master processor cores. The design structure also includes a plurality of cache memories, each cache memory being coupled to a respective master processor core. The design structure further includes a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request sending the PBC sends a reflected command to any master processor core, system memory and I/O slave device that the PBC determines to be within the referenced address range. In one embodiment of the design structure, in response to the reflected command, the master processor cores, system memory and slave I/O device in the referenced address range, send respective partial responses to the PBC, such that the PBC blocks the partial response of the memory controller, the master processor cores, and the master I/O device but not the slave I/O device from inclusion in a combined response that the PBC sends to master processor cores, master I/O devices and system memory.

In another embodiment, a hardware description language (HDL) design structure is encoded on a machine-readable data storage medium. The design structure includes elements that when processed in a computer-aided design system generates a machine-executable representation of a processor integrated circuit. The HDL design structure includes a first element processed to generate a functional computer-simulated representation of a plurality of master processor cores. The HDL design structure also includes a second element processed to generate a functional computer-simulated representation of a plurality of cache memories, each cache memory being coupled to a respective master processor core. The HDL design structure further includes a third element processed to generate a functional computer-simulated representation of a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request sending the PBC sends a reflected command to any master processor core, system memory and I/O slave device that the PBC determines to be within the referenced address range. The HDL design structure may further specify that in response to the reflected command, the master processor cores, system memory and slave I/O device in the referenced address range, send respective partial responses to the PBC, such that the PBC blocks the partial response of the memory controller, the master processor cores, and the master I/O device but not the slave I/O device from inclusion in a combined response that the PBC sends to master processor cores, master I/O devices and system memory.

In yet another embodiment, a method in a computer-aided design system for generating a functional design model of a processor integrated circuit is disclosed. The method includes generating a functional computer-simulated representation of a plurality of master processor cores. The method also includes generating a functional computer-simulated representation of a a plurality of cache memories, each cache memory being coupled to a respective master processor core. The method further includes generating a functional computer-simulated representation of a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request sending the PBC sends a reflected command to any master processor core, system memory and I/O slave device that the PBC determines to be within the referenced address range. The method may provide that in response to the reflected command, the master processor cores, system memory and slave I/O device in the referenced address range, send respective partial responses to the PBC, such that the PBC blocks the partial response of the memory controller, the master processor cores, and the master I/O device but not the slave I/O device from inclusion in a combined response that the PBC sends to master processor cores, master I/O devices and system memory.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
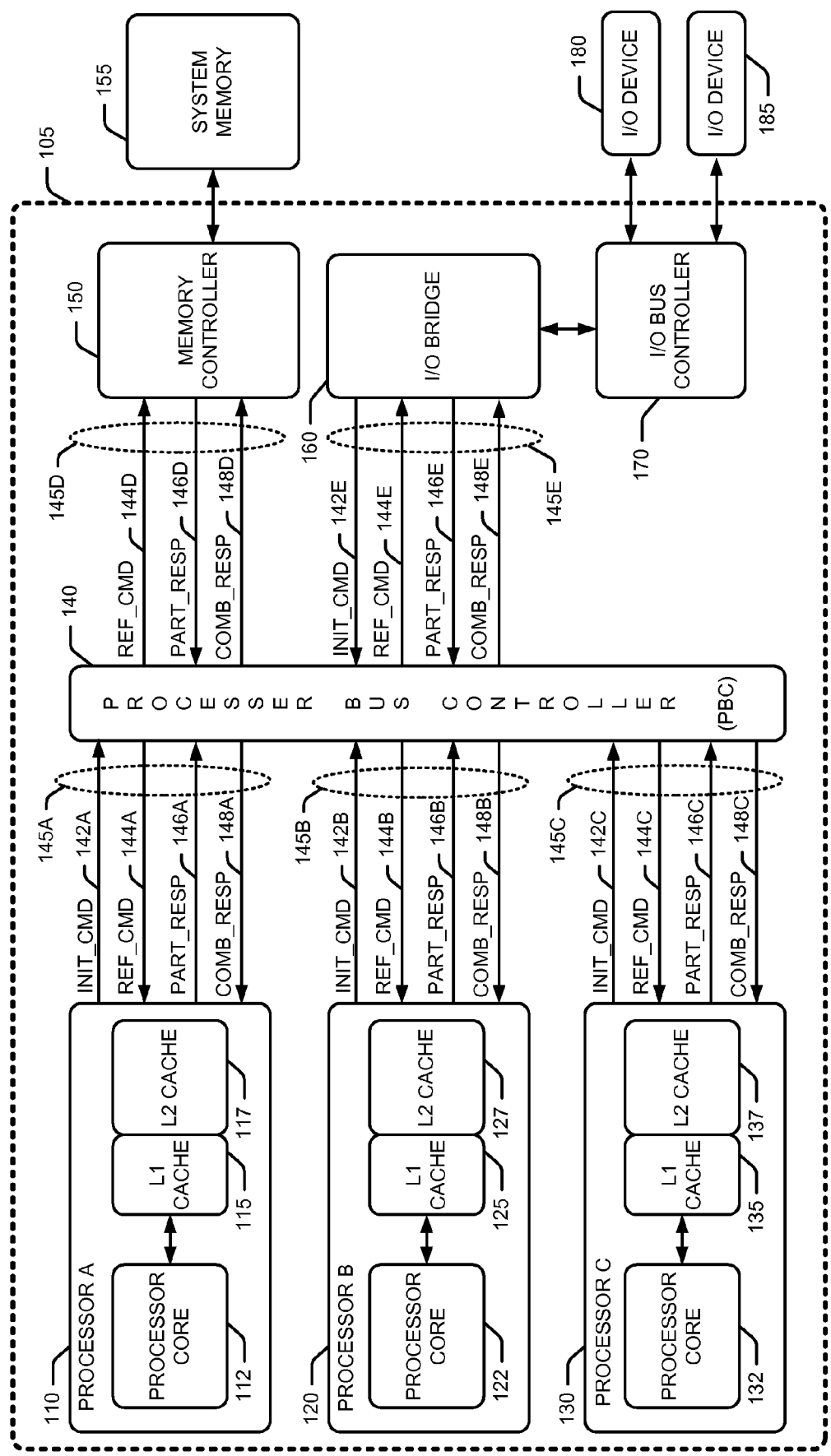
FIG. 1 is a block diagram of a conventional information handling system with multiple processors, caches, and cache coherency protocol capability.

Cache coherency protocols refer to methodologies that manage the integrity of data in caches such as those that reside in a processor or processor core. A particular processor core may include multiple caches that support the memory read and write requirements of that particular processor core. Cache coherency protocols, such as the modified, shared, invalid (MSI) protocol, the modified, exclusive, shared, invalid (MESI) protocol, and the modified, owned, shared, invalid, (MOSI) protocol, and other protocols are crucial to the accuracy, integrity, and efficient management of multiple cache, multiple processor, and multiple processing task systems.

IHSs may include master devices such as master processors, master I/O devices, as well as other master devices. A particular master device may request data from a memory location external to itself but within the IHS. Master devices often employ local or on-board caches for storing memory data for efficient and fast access. IHSs also include slave devices such as read only memories, peripherals, slave I/O devices, and other slaves. Slave devices do not typically have the ability to access memory data external to themselves. A master device or other controlling device within an IHS typically governs the actions of a slave device.

An IHS may include a snoop device or snooper that may include a cache memory. The snoop device maintains the integrity of the data in its cache memory. Snoop devices may be master devices, slave devices, or other devices that monitor cache memory data integrity of other devices within the IHS. An IHS may include a processor bus controller (PBC) that provides snoop devices with information to allow snoop devices to track the integrity of their local caches.

Unfortunately, cache data integrity problems may arise when multiple master devices such as processors and processor cores maintain caches with a common memory resource or backup such as a system memory, in a system without a cache coherency mechanism. One common problem occurs when one cache of multiple caches contains data from a particular IHS memory location and another cache of multiple caches contains an older copy of that same IHS memory location. The older copy of that same IHS memory location may be an invalid data copy. The cache with the invalid data copy may be unaware that the data is not valid. When another master device requests a copy of that memory data, the cache with invalid data could offer the information as valid. Cache coherency protocols manage such conflicts and maintain consistency among multiple caches and system memory.

Cache "snooping" is one methodology that snoop devices with caches use to support cache coherency protocols. Snooping involves a process wherein individual caches monitor address lines or address reference data for memory accesses matching their respective cache stores. When a snoop device observes a memory data write operation consistent with its local caches, that snoop device invalidates its own copy of the memory data. An arbitrator, memory data bus controller, network switch, or other device such as a PBC, selects commands to be broadcast by the arbitrator to all snoop devices. The arbitrator or other device selects the commands to be broadcast as reflected commands. Snoop devices monitor the resultant broadcasts to determine what action, if any, should be taken by the snoop device within the snoop device local caches.

FIG. 1 shows a conventional information handling system IHS 100 with cache coherency protocol capability that includes many structures integrated on a common semiconductor chip 105. IHS 100 includes multiple processors and multiple caches or cache memories. IHS 100 includes a processor A 110 with a processor core 112. Processor core 112 is a "master processor core" since processor A 110 is a master device of IHS 100. Processor core 112 couples to an L1 cache 115 that couples to an L2 cache 117 within processor A 110. In conventional processor systems, L1 cache 115 is typically smaller than L2 cache 117 and provides processor core 112 with the closest and fastest memory data in comparison with other data stores available to processor core 112.

If processor core 112 requests particular memory data from L1 cache 115, and L1 cache 115 returns a "cache hit", the particular memory data is available from L1 cache 115. However, if processor core 112 requests particular memory data from L1 cache 115, and L1 cache 115 returns a "cache miss", the particular memory data is not available from L1 cache 115. Processor core 112 continues searching by passing the data request through L1 cache 115 into L2 cache 117 to attempt to find the particular memory data. If L2 cache 117 returns a "cache miss", the particular data is not available from L2 cache 117. In the case wherein the particular data is not available from any internal cache of processor A 110, processor core 112 must initiate a data request external to processor A 110 for the particular memory data. That particular memory data may reside in another processor, system memory, an I/O device, or any other memory location inside or outside of chip 105. Processor A 110 is a master device of IHS 100 because it has the capability of initiating memory data requests.

IHS 100 includes a processor B 120 with a processor core 122. Processor core 122 couples to an L1 cache 125 that couples to an L2 cache 127 within processor B 120. L1 cache 125 is typically smaller than L2 cache 127 and provides processor core 122 with the closest and fastest memory data in comparison with other data stores available to processor core 122. If processor core 122 requests particular memory data from L1 cache 125, and L1 cache 125 returns a "cache miss", the particular memory data is not available from L1 cache 125. Processor core 122 continues searching by passing the data request through L1 cache 125 into L2 cache 127 in an attempt to find the particular memory data. If L2 cache 127 returns a "cache miss", the particular data is not available from L2 cache 127. In the case where the particular data is not available from any internal cache of processor B 120, processor core 122 must initiate a data request external to processor B 120 for the particular memory data. That particular memory data may reside in another processor, system memory, an I/O device, or any other memory location inside or outside of chip 105. Processor B 120 is a master device of IHS 100 because it has the capability of initiating memory data requests.

IHS 100 includes a processor C 130 with a processor core 132. Processor core 132 couples to an L1 cache 135 that couples to an L2 cache 137 within processor C 130. In conventional processor systems, L1 cache 135 is typically smaller than L2 cache 137 and provides processor core 132 with the closest and fastest memory data in comparison with other data stores available to processor core 132. If processor core 132 requests a particular memory data from L1 cache 135, and L1 cache 135 returns a "cache miss", the particular memory data is not available from L1 cache 135. Processor core 132 continues searching by passing the data request through L1 cache 135 into L2 cache 137 to attempt to find the particular memory data. If L2 cache 137 returns a "cache miss", the particular data is not available from L2 cache 137. In the case where the particular data is not available from any internal cache of processor C 130, processor core 132 must initiate a data request external to processor C 130 for the particular memory data. That particular memory data may reside in another processor, system memory, an I/O device, or any other memory location inside or outside of chip 105. Processor C 130 is a master device of IHS 100 because it has the capability of initiating memory data requests.

A processor bus controller (PBC) 140 couples to processor A 110 via a communications interface 145A that includes four cache coherency protocol busses, namely an INIT_CMD bus 142A, a REF_CMD bus 144A, a PART_RESP bus 146A and a COMB_RESP bus 148A. Cache coherency protocol INIT_CMD bus 142A is an "initial command" communications bus that a master device such as processor A 110 uses to communicate with PBC 140. In particular, processor A 110 uses the INIT_CMD bus 142A to communicate a memory data request.

Cache coherency protocol REF_CMD bus 144A is one of multiple REF_CMD busses that a bus controller such as PBC 140 utilizes to communicate with all snoop devices such as processor A 110. Snoop devices include any devices that communicate with PBC 140 and also contain copies of any particular data that a master device may require. More specifically, the REF_CMD bus 144A communicates a reflection or copy of data request communications from other master devices within IHS 100. In other words, PBC 140 receives data request commands from one or multiple master devices and reflects those commands to one or multiple snoop devices within IHS 100.

In response to the reflected command on the REF_CMD bus 144A, processor A 110 returns a "partial response" on the PART_RESP bus 146A. PBC 140 interprets each partial response from snoop devices, such as processor A 110, as one partial communication of the total communication or responses from all snoop devices in IHS 100. The partial response communication includes information pertaining to a memory data request from a particular master device, such as master device processor A 110. PBC 140 may combine the results of partial responses from all snoop devices within IHS 100 and generate a "combined response" communication. PBC 140 sends the combined response communication on the COMB_RESP bus 148A to processor A 110. The particular sequence of events of cache coherency protocol communications will be described in more detail below.

PBC 140 couples to processor B 120 via a communications interface 145B that includes four cache coherency protocol busses, namely an INIT_CMD bus 142B, a REF_CMD bus 144B, a PART_RESP bus 146B and a COMB_RESP bus 148B. Cache coherency protocol INIT_CMD bus 142B is an initial command communications bus that a master device such as processor B 120 uses to communicate with PBC 140.

In particular, processor B 120 utilizes the INIT_CMD bus 142B to communicate a memory data request external to processor B 120.

Cache coherency protocol REF_CMD bus 144B is one of multiple REF_CMD busses that PBC 140 employs to communicate with all snoop devices such as processor B 120. More specifically, the REF_CMD bus 144B communicates a reflection or copy of communication data requests from other master devices within IHS 100. PBC 140 receives data request commands from one or multiple master devices and reflects those commands to one or multiple snoop devices within IHS 100. In response to the reflected command on the REF_CMD bus 144B, processor B 120 returns a "partial response" on the PART_RESP bus 146B. The partial response communication includes information pertaining to a memory data request from a particular master device. PBC 140 may combine the results of partial responses from all snoop devices within IHS 100 and generate a combined response communication. Processor bus controller sends the combined response communication on the COMB_RESP bus 148B to processor B 120.

PBC 140 couples to processor C 130 via a communications interface 145C that includes four cache coherency protocol busses, namely an INIT_CMD bus 142C, a REF_CMD bus 144C, a PART_RESP bus 146C and a COMB_RESP bus 148C. Cache coherency protocol INIT_CMD bus 142C is an initial command communications bus that a master device such as processor C 130 uses to communicate with PBC 140. In particular, processor C 130 uses the INIT_CMD bus 142C to communicate a memory data request external to processor C 130.

Cache coherency protocol REF_CMD bus 144C is one of multiple REF_CMD busses that PBC 140 uses to communicate with all snoop devices such as processor C 130. More specifically, the REF_CMD bus 144C communicates a reflection or copy of communication data requests from other master devices within IHS 100. In other words, PBC 140 receives data request commands from one or multiple master devices and reflects those commands to one or multiple snoop devices within IHS 100. In response to the reflected command on the REF_CMD bus 144C, processor C 130 returns a partial response on the PART_RESP bus 146C. The partial response communication includes information pertaining to a memory data request from a particular master device. PBC 140 may combine the results of partial responses from all snoop devices within IHS 100 and generate a combined response communication. Processor bus controller sends the combined response communication on the COMB_RESP bus 148C to processor C 130.

IHS 100 includes a memory controller 150 that couples to PBC 140 via a communications interface 145D that includes three cache coherency protocol busses, namely a REF_CMD bus 144D, a PART_RESP bus 146D and a COMB_RESP bus 148D. These cache coherency interface busses, REF_CMD bus 144D, PART_RESP bus 146D, and COMB_RESP bus 148D correspond to a reflected command bus, a partial response bus and a combined response bus, respectively. Memory controller 150 couples to a system memory 155 that provides random access storage for IHS 100.

An I/O bridge 160 couples to PBC 140 via a communications interface 145E that includes four cache coherency protocol busses, namely an INIT_CMD bus 144E, a REF_CMD bus 144E, a PART_RESP bus 146E and a COMB_RESP bus 148E. These cache coherency interface busses INIT_CMD bus 142E, REF_CMD bus 144E, PART_RESP bus 146E, and COMB_RESP bus 148E correspond to an initial command bus, a reflected command bus, a partial response bus and a combined response bus, respectively. I/O bridge 160 couples to an I/O bus controller 170 that allows chip 105 to communicate with other I/O devices external to chip 105. IHS 100 includes I/O device 180 and I/O device 185 that couple to I/O bus controller 170 as shown. I/O device 180 and I/O device 185 represent any device external to chip 105 that may transfer data, such as a hard drives, USB drives, and DVD drives, for example.

IHS 100 includes four cache coherency bus groups namely, an initial command group 142, a reflected command group 144, a partial response group 146, and a combined response group 148. Each bus group includes multiple conductors with respective signals that communicate primarily in the direction of the respective arrows, as shown in FIG. 1. The initial command bus group 142 includes the INIT_CMD bus 142A, the INIT_CMD bus 142B, the INIT_CMD bus 142C, and the INIT_CMD bus 142E. Memory controller 150 does not employ an initial command bus. The reflected command bus group 144 includes the REF_CMD bus 144A, the REF_CMD bus 144B, the REF_CMD bus 144C, the REF_CMD bus 144D, and the REF_CMD bus 144E. The partial response bus group 146 includes the PART_RESP bus 146A, the PART_RESP bus 146B, the PART_RESP bus 146C, the PART_RESP bus 146D, and the PART_RESP bus 146E. The combined response bus group 148 includes the COMB_RESP bus 148A, the COMB_RESP bus 148B, the COMB_RESP bus 148C, the COMB_RESP bus 148D, and the COMB_RESP bus 148E. One cache coherency bus group, such as the initial command group 142, may include as many as 100 signals or more. Reducing the number of signals and interconnects in an IHS is very desirable.

In the example of FIG. 1, IHS 100 employs master devices such as processor A 110, processor B 120, processor C 130, and I/O bridge 160. Master devices may initiate memory data requests via the initial command bus group 142 to communicate a memory data request. IHS 100 also includes slave devices such as system memory 155, slave I/O device 180, slave I/O device 185, or other slave devices (not shown). Slave devices may store memory data or other information that a master device may request at any time within IHS 100. Stated alternatively, master devices store, send and request data for storage or other use, whereas slave devices store and/or transfer data in response to a master device's request or control.

IHS 100 includes snoop devices, namely processor A 110, processor B 120, processor C 130, memory controller 150, and I/O bridge 160. Snoop devices include any device capable of storing information that another master device of IHS 100 may make request. Snoop devices utilize reflected command bus group 144, partial response bus group 146, and combined response bus group 148.

Figure 2:
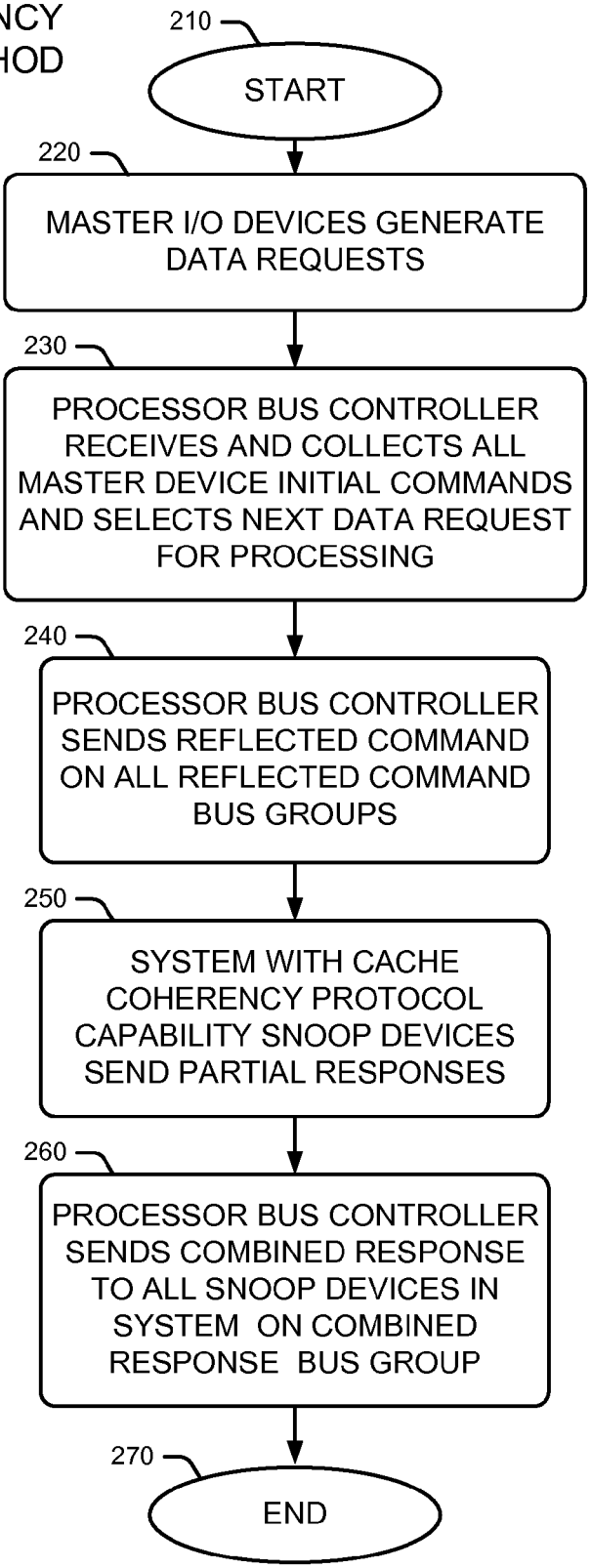
FIG. 2 is a flow chart that depicts an example of a cache coherency protocol method of the system of FIG. 1.

FIG. 2 is a flowchart that depicts process flow in the conventional cache coherency methodology that IHS 100 employs. In more detail, FIG. 2 shows conventional master device and slave device data communications that cooperate in the management of cache memory integrity. Process flow begins at start block 210. A master device, such as processor A 110 of IHS 100, initiates a memory data request by generating an initial command. For example, processor A 110 may generate a memory data request with an initial command on the INIT_CMD bus 142A. Master devices generate data requests, as per block 220.

Master device processor A 110 utilizes the INIT_CMD bus 142A. Processor B 120 utilizes the INIT_CMD bus 142B. Processor C 130 utilizes the INIT_CMD bus 142C. Other master device I/O bridge 160 utilizes the INIT_CMD bus 142E. PBC 140 utilizes the initial command bus group 142 as a communication interface to all master devices requesting memory data within IHS 100.

Memory controller 150 is not a master device in this particular implementation and does not generate an initial command or request for memory data therein. Each master device of IHS 100 may initiate a data request by generating an initial command signal on a corresponding INIT_CMD bus. The master devices send initial commands on the INIT_CMD busses to the PBC 140 for interpretation and processing. PBC 140 receives and collects all initial commands from master devices of IHS 100 and determines which data request to select for processing next, as per block 230. IHS 100 supports request pipelining, namely the ability to have multiple data requests in process or "in flight" at the same time. This is particularly important in a multi-tasking environment such as the multi-processor architecture of IHS 100.

In response to receiving an initial command signal from a particular master or snoop device, such as processor A 110 for example, PBC 140 sends a reflected command on each reflected command bus group 144 to each snoop device of IHS 100, as per block 240. Each device of system IHS that resides on a reflected command bus in reflected command bus group 144 is a snoop device. Snoop devices may be master devices or other devices within IHS 100 that monitor the address range of a particular data request by any other master device. If that particular data request includes a reference to an address range that matches an address range within the local cache of the snoop device receiving the reflected command, cache coherency protocols require the snoop device to respond with information about the snoop device's particular memory data. Stated in another manner, PBC 140 sends a copy of the request from a master device for data to all devices within IHS 100 that may contain that data or manage that data in other devices.

In more detail, PBC 140 sends the reflected command to processor A 110 on the REF_CMD bus 144A. PBC 140 sends the reflected command to processor B 120 on the REF_CMD bus 144B, and to processor C 120 on the REF_CMD bus 144C. PBC 140 sends the reflected command to memory controller 150 on the REF_CMD bus 144D and to I/O bridge 160 on the REF_CMD bus 144E.

Each device of IHS 100 that receives the reflected command interprets the command or request for memory data and responds with a partial response. Each snoop device that receives a reflected command sends a partial response, as per block 250. A snoop device such as processor A 110 responds to a reflected command from PBC 140 with a partial response communication on the PART_RESP bus 146A. Processor B 120 responds to a reflected command from PBC 140 with a partial response communication on the PART_RESP bus 146B. Processor C 130 responds to a reflected command from PBC 140 with a partial response communication on the PART_RESP bus 146C. Memory controller 150 responds to a reflected command from PBC 140 with a partial response communication on the PART_RESP bus 146D. I/O bridge 160 responds to a reflected command from PBC 140 with a partial response communication on the PART_RESP bus 146E.

Each partial response from a snoop device to PBC 140 on partial response bus group 146 takes the form of one of multiple response types. One type of a partial response from a specific snoop device within IHS 100 is a "retry response". A retry response instructs PBC 140 to resend the reflected command signal again to that specific snoop device. Such a retry response from the specific snoop device may signal the process bus controller 140 that the snoop device is busy and cannot respond at the present time. A snoop device retry response could be the result of many conditions, such as waiting for data to settle, the bus is busy, or other reasons.

Another partial response type that a snoop device may send is the "acknowledge" response. Upon receiving an acknowledge response, PBC 140 interprets that response as a lack of data availability from the snoop device that sends that response. The snoop device may not have the data in its local cache or any other reason for returning an acknowledge response. Different types of snoop device partial responses are known to those skilled in the art.

To maintain cache coherency, in one implementation PBC 140 interprets each partial response from each snoop device and combines the responses into a special information communication. That special information communication is a combined response communication that utilizes the combined response bus group 148. PBC 140 utilizes the combined response bus group 148 to send a combined response-communication to each snoop device in IHS 100, as per block 260.

Snoop devices or other devices in IHS 100 that maintain memory data for sharing with other devices must maintain an accurate representation of that memory data. Maintaining data integrity for cache memory data in a device such as processor A 110 is known as cache coherency. Cache memory is a copy of some other memory location in IHS 100. Processor A 110 monitors communications on the local cache coherency busses namely, the INIT_CMD bus 142A, the REF_CMD bus 144A, the PART_RESP bus 146A, and the COMB_RESP bus 148A. Monitoring the data communications on the local cache coherency busses allows processor A 110 to maintain an accurate representation of the memory data within L1 cache 115, and L2 cache 117. For example, L1 cache 115 may contain a copy of particular memory data that resides in a primary storage location in system memory 155. In that scenario, L1 cache 115 must be under strict cache coherency control. The cache coherency protocol method ends, per end block 270.

Processor A 110 may monitor a communication on communications interface 145A that indicates a copy of the particular memory data in system memory 155 is changing. If that condition occurs, then the data in L1 cache 115 is no longer valid. Processor A 110 must modify that memory data location in L1 cache as invalid. Subsequent requests for that data must indicate the invalid status of that memory to any other device in IHS 100 that requests that data. At a future time, processor A 110 may update the memory data it receives from system memory 155 and remove the invalid reference. In the same manner, other snoop devices of IHS 100 maintain their local cache memory store integrity.

One major problem with this approach is that all initiating, or data requesting, snoop devices must receive and process the combined response signals regardless of whether they generate data requests or not. A reduction in cache coherency bus configuration is possible by analyzing the master or slave status of I/O devices. For example, I/O devices do not typically require full cache coherency protocols. Attachment to the full array of cache coherency busses is not entirely necessary. Moreover, it is often not desirable for an I/O device to include the complexity of the logic required to participate fully in the cache coherency protocol methodology.

Figure 3:
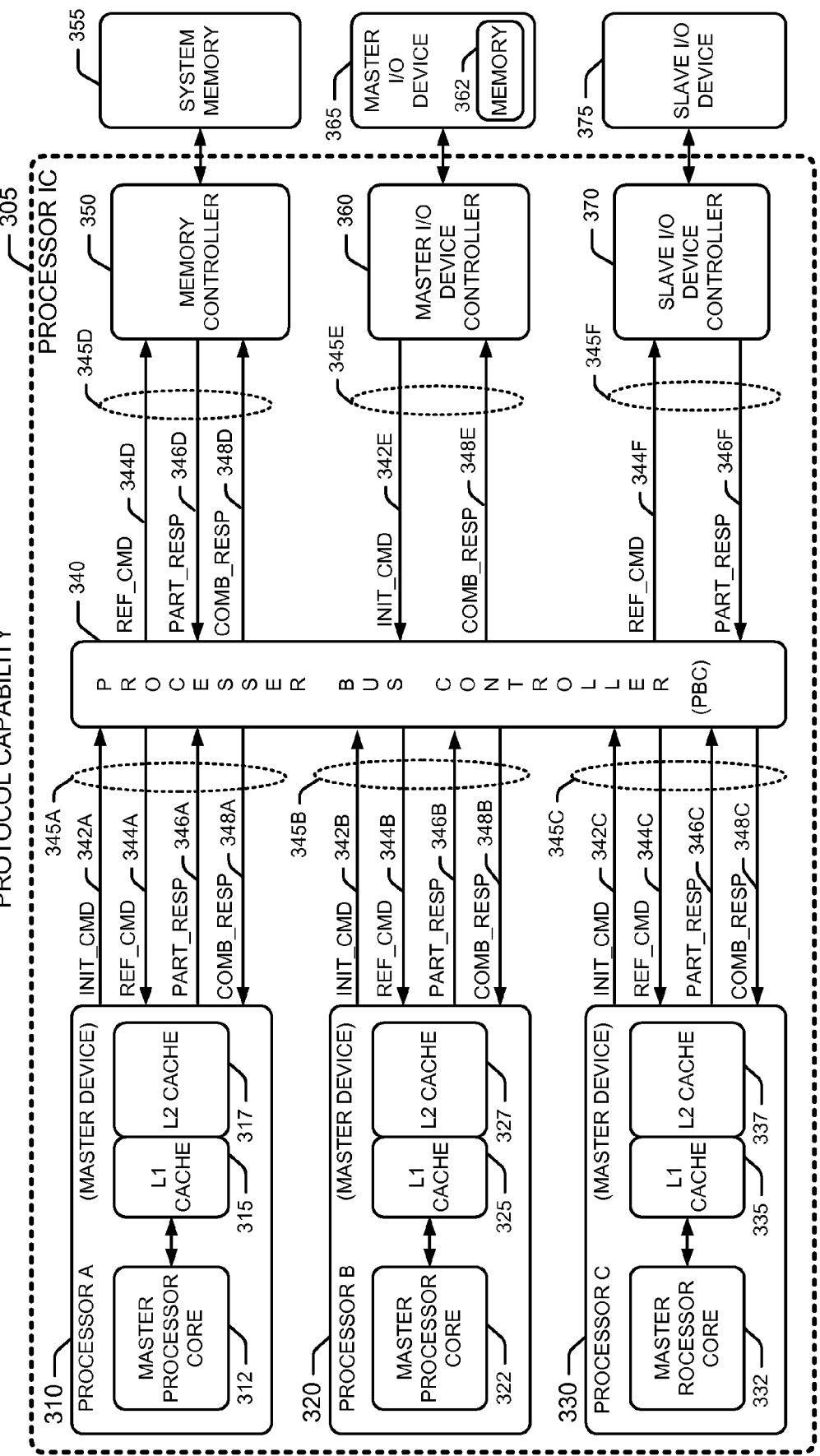
FIG. 3 is a block diagram of the disclosed information handling system with multiple processors, caches, and enhanced cache coherency protocol capability.

FIG. 3 depicts an information handling system (IHS) 300 with enhanced cache coherency protocol capability. In one embodiment, IHS 300 includes a processor integrated circuit (IC) chip 305 including multiple processors and respective multiple caches or cache memories. IHS 300 includes a processor A 310 with a processor core 312. Processor core 312 is a master processor core since processor A 310 is a master device of IHS 300. Processor core 312 couples to an L1 cache 315 that couples to an L2 cache 317 within processor A 310. L1 cache 315 may be smaller, namely include less memory, than the L2 cache 317. L1 cache 315 provides processor core 312 with local fast access to memory data.

If processor core 312 requests particular memory data from L1 cache 315, and L1 cache 315 returns a "cache hit", then the particular memory data is available from L1 cache 315. However, if processor core 312 requests particular memory data from L1 cache 315, and L1 cache 315 returns a "cache miss", the particular memory data is not available from L1 cache 315. Processor core 312 then continues searching for the particular memory data by passing the data request through L1 cache 315 into L2 cache 317 in an attempt to find the particular memory data. If L2 cache 317 returns a "cache miss", the particular data is not available from L2 cache 317. If the particular data is not available from any internal cache of processor A 310, then processor core 312 will initiate a data request to memory external to processor A 310 in an attempt to locate and access the particular memory data. That particular memory data may reside in another processor such as processor B 320 or processor C 330, or in system memory 355, or in master I/O device 365 or slave I/O device 375, or any other memory location inside or external to IHS 300. Processor A 310 is a master device of IHS 300 with the capability of initiating memory data requests.

IHS 300 includes a processor B 320 with a processor core 322. Processor core 322 couples to an L1 cache 325 that couples to an L2 cache 327 within processor B 320. L1 cache 325 may be smaller than L2 cache 327 and provides processor core 322 with local fast access to memory data. Processor B 320 is a master device of IHS 300 with the capability of initiating memory data requests. IHS 300 also includes a processor C 330 that includes a processor core 332. Processor core 332 couples to an L1 cache 335 that couples to an L2 cache 337 within processor C 330. L1 cache 335 is typically smaller than L2 cache 337 and provides processor core 332 with fast local access to memory data. Processor C 330 is a master device of IHS 300 with the capability of initiating memory data requests.

A processor bus controller (PBC) 340 couples to processor A 310 via a communications interface 345A that includes four cache coherency protocol busses, namely an INIT_CMD bus 342A, a REF_CMD bus 344A, a PART_RESP bus 346A and a COMB_RESP bus 348A. PBC 340 acts as both an arbiter and a gateway for handling data requests in the manner described in more detail below. Cache coherency protocol INIT_CMD bus 342A is an "initial command" communications bus that a master device such as processor A 310 uses to communicate with PBC 340. In particular, processor A 310 uses the INIT_CMD bus 342A to communicate a memory data request to PBC 340.

Cache coherency protocol REF_CMD bus 344A is a "reflected command" bus that a bus controller such as PBC 340 utilizes to communicate with a snoop device, namely processor A 310. Snoop devices are any devices that communicate with PBC 340 and that also include a copy of data that a master device may require. More specifically, the REF_CMD bus 344A communicates a reflection or copy of communication data requests from other master devices within IHS 300. PBC 340 receives data request commands from one or multiple master devices and reflects those commands to one or multiple snoop devices within IHS 300.

In response to the reflected command on the REF_CMD bus 344A, processor A 310 returns a "partial response" on the PART_RESP bus 346A. The partial response communication includes information pertaining to a memory data request from a particular master device. For example, the partial response may be a "retry", "acknowledge", or other partial response. Different types of snoop device partial responses are known to those skilled in the art. PBC 340 may combine the results of partial responses from all snoop devices within IHS 300 and generate a "combined response". PBC 340 sends the combined response communication on the COMB_RESP bus 348A to processor A 310.

PBC 340 couples to processor B 320 via a communications interface 345B that includes four cache coherency protocol busses, namely an INIT_CMD bus 342B, a REF_CMD bus 344B, a PART_RESP bus 346B and a COMB_RESP bus 348B. The cache coherency protocol INIT_CMD bus 342B is an initial command communications bus that a master device such as processor B 320 uses to communicate with PBC 340. In particular, processor B 320 utilizes the INIT_CMD bus 342B to initiate a memory data request to devices external to processor B 320.

Cache coherency protocol REF_CMD bus 344B is a reflected command bus that PBC 340 utilizes to communicate to a snoop device, namely processor B 320. More specifically, the REF_CMD bus 344B contains a reflection or copy of communication data requests from other master devices within IHS 300. In other words, PBC 340 receives data request commands from one or multiple master devices and reflects those commands to one or multiple snoop devices within IHS 300.

In response to the reflected command on the REF_CMD bus 344B, processor B 320 returns a partial response on the PART_RESP bus 346B. The partial response communication includes information pertaining to a memory data request from a particular master device. PBC 340 may combine the results of partial responses from all snoop devices within IHS 300 and generate a combined response. Processor bus controller PBC 340 sends the combined response communication on the COMB_RESP bus 348B to processor B 320.

PBC 340 couples to processor C 330 via a communications interface 345C that includes four cache coherency protocol busses namely, an INIT_CMD bus 342C, a REF_CMD bus 344C, a PART_RESP bus 346C and a COMB_RESP bus 348C. The cache coherency protocol INIT_CMD bus 342C is an initial command communications bus that a master device such as processor C 330 uses to communicate with PBC 340. In particular, processor C 330 uses the INIT_CMD bus 342C to communicate a memory data request to devices external to processor C 330.

Cache coherency protocol REF_CMD bus 344C is a reflected command bus that PBC 340 utilizes to communicate with a snoop device, namely processor C 330. More specifically, the REF_CMD bus 344C communicates a reflection or copy of communication data requests from other master devices within IHS 300. PBC 340 receives data request commands from one or multiple master devices and reflects those commands to one or multiple snoop devices within IHS 300.

In response to the reflected command on the REF_CMD bus 344C, processor C 330 returns a partial response on the PART_RESP bus 346C. The partial response communication includes information pertaining to a memory data request from a particular master device. PBC 340 may combine the results of partial responses from all snoop devices within IHS 300 and generate a combined response. Processor bus controller sends the combined response communication on the COMB_RESP bus 348C to processor C 330.

IHS 300 includes a memory controller 350 that couples to PBC 340 via a cache coherency protocol communications interface 345D. Interface 345D includes a REF_CMD bus 344D, a PART_RESP bus 346D, and a COMB_RESP bus 348D. These cache coherency interface busses REF_CMD bus 344D, PART_RESP bus 346D, and COMB_RESP bus 348D respectively communicate the reflected command, partial response and combined response. These interface busses 344D, 346D, and 348D form the cache coherency protocol communications interface 345D of PBC 340 to memory controller 350. Memory controller 350 couples to a system memory 355.

PBC 340 couples to a master I/O device controller 360 via a communications interface 345E that includes two cache coherency protocol busses namely, an INIT_CMD bus 342E and a COMB_RESP bus 348E. Master I/O device controller 360 couples to a master I/O device 365. The cache coherency protocol INIT_CMD bus 342E is an initial command communications bus that a master device controller such as master I/O device controller 360 uses to communicate with PBC 340. Master I/O device controller 360 uses the INIT_CMD bus 342E to communicate a memory data request to any memory within IHS 300. Master I/O device 365 may include a local on-board memory store 362 that may not take the form of a cache. PBC 340 couples to a slave I/O device controller 370 via a communications interface 345F that includes two cache coherency protocol busses, namely a REF_CMD bus 344F and a PART_RESP bus 346F. Slave I/O device controller 370 couples to a slave I/O device 375.

The cache coherency protocol REF_CMD bus 344F is a reflected command communications bus that PBC 340 uses to send copies of master device memory data requests to slave I/O device 375. The cache coherency protocol PART_RESP bus 346F is a partial response communication bus that slave I/O device controller 370 utilizes to communicate with PBC 340. More particularly, in response to reflected commands, slave I/O device controller 370 communicates with PBC 340 via the PART_RESP bus 346F. Master I/O device 365 is an external I/O device capable of storing and retrieving memory data information. An external device is a device outside of processor IC chip 305. A network server and other similar storage devices are examples of master I/O devices. Slave I/O device 375 represents any device external to processor IC chip 305 that may store and transfer data, for example a hard drive, USB drive, a DVD drive, etc. In other embodiments, more I/O devices (not shown) may connect to PBC 340 in a similar manner to the way master I/O device 365 and slave I/O device 375 connect to PBC 340. As shown in FIG. 3, both master I/O device 365 and slave I/O device 375 couple indirectly to PBC 340 via master I/O device controller 360 and slave I/O device controller 370, respectively. Master I/O device controller 360 and slave I/O device controller 370 couple to PBC 340 via interface busses 345E and 345F, respectively. System memory 355, which is not a master device, couples to PBC 340 indirectly via memory controller 350.

IHS 300 includes four cache coherency bus groups, namely the initial command group 342, the reflected command group 344, the partial response group 346, and the combined response bus group 348. Each bus group represents multiple conductors with multiple signals primarily transmitting in the directions of the arrows as shown in FIG. 3 at the edge of PBC 340. The initial command bus group 342 includes the INIT_CMD bus 342A, the INIT_CMD bus 342B, the INIT_CMD bus 342C, and the INIT_CMD bus 342E. Memory controller 350 and slave I/O device controller 370 do not employ an initial command bus.

The reflected command bus group 344 includes the REF_CMD bus 344A, the REF_CMD bus 344B, the REF_CMD bus 344C, the REF_CMD bus 344D, and the REF_CMD bus 344F. Master I/O device 365 does not employ a reflected command bus. The partial response bus group 346 includes the PART_RESP bus 346A, the PART_RESP bus 346B, the PART_RESP bus 346C, the PART_RESP bus 346D, and the PART_RESP bus 346F. Master I/O device 365 does not employ a partial response bus. The combined response bus group 348 includes the COMB_RESP bus 348A, the COMB_RESP bus 348B, the COMB_RESP bus 348C, the COMB_RESP bus 348D, and the COMB_RESP bus 348E. Slave I/O device controller 370 does not employ a combined response bus.

In the embodiment of FIG. 3, IHS 300 employs master devices, namely processor A 310, processor B 320, processor C 330, and master I/O device 365. Master devices may initiate memory data requests utilizing the initial command bus group 342 to communicate such a memory data request to other master devices or snoop devices of IHS 300. IHS 300 includes slave devices, namely system memory 355, slave I/O device 375, and any other slave devices (not shown). Slave devices may store memory data or other information that a master device may request at any time within IHS 300. In other words, master devices store, send and request data for storage or other use, and slave devices store and/or transfer data in response to a master devices request or control.

IHS 300 includes snoop devices, namely processor A 310, processor B 320, processor C 330, and memory controller 350. A snoop device is any device capable of storing information that another master device of IHS 300 may request. Snoop devices utilize the initial command bus group 342, the reflected command bus group 344, the partial response bus group 346, and the combined response bus group 348 to communicate with PBC 340.

IHS 300 supports request pipelining, namely the ability to have multiple data request in process or "in flight" at the same time. This is particularly important in a multi-tasking environment such as the multi-processor architecture of IHS 300. One method of managing multiple data requests "in flight" is a "serialization technique". The serialization technique blocks the progress of data requests by forcing data request retries. For example, PBC 340 generates data request retries on any data request trying to access or modify memory data from a current "in flight" data request. IHS 300 may use an adjacent address map protection or physical address attribute map (PAAM) scheme to accomplish serialization. One such serialization methodology is disclosed in U.S. Pat. No. 6,405,289 entitled "Multiprocessor System In Which A Cache Serving As A Highest Point Of Coherency Is Indicated By A Snoop Response", inventors Arimilli, et al., the disclosure of which is incorporated herein by reference in its entirety. PAAM or "coherency triangle" protection techniques effectively block any data requests that have an address that matches the address of a data request in flight.

Figure 4:
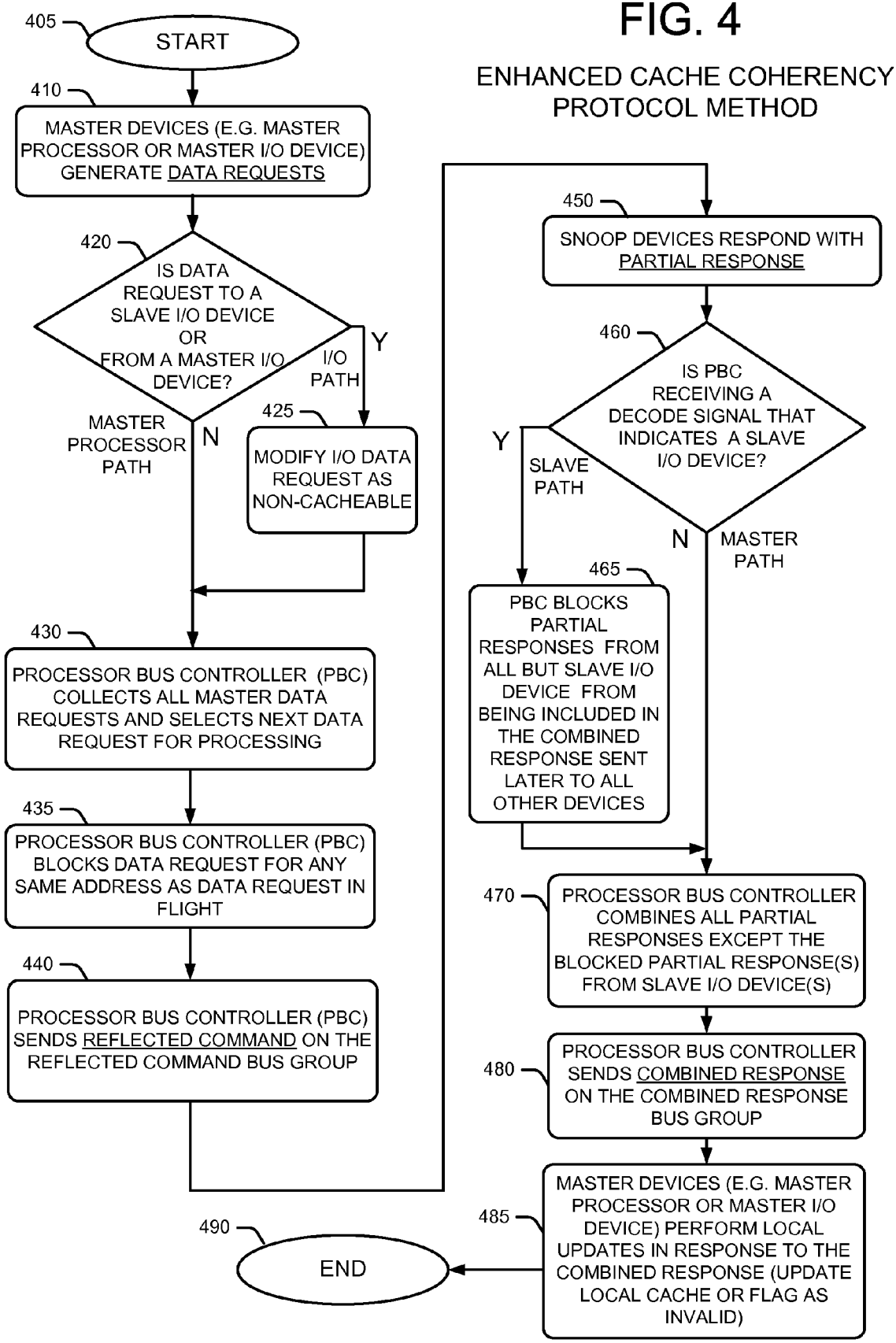
FIG. 4 is a flow chart that depicts an example of an enhanced cache coherency protocol method that the system of FIG. 3 employs.

FIG. 4 is a flowchart that depicts process flow in IHS 300 with enhanced cache coherency protocol capability. In more detail, FIG. 4 shows a methodology wherein master devices, slave devices, and snoop devices communicate data in a manner that manages and preserves cache memory integrity. Process flow begins at start block 405. A master device, such as processor A 310 of IHS 300, initiates a data request by generating an initial command. For example, processor A 310 may generate a particular memory data request with an initial command on the INIT_CMD bus 342A. The particular data request from processor A 310 includes a reference address or address range of the memory data request. For example, the particular memory data request may reference an address range of system memory 355, an address range of slave I/O device 375, or any other data memory location.

Master devices generate data requests by transmitting respective initial commands, as per block 410. Master device processor A 310 utilizes the INIT_CMD bus 342A, processor B 320 utilizes the INIT_CMD bus 342B, and processor C 330 utilizes the INIT_CMD bus 342C to transmit such data requests to PBC 340. Another master I/O device controller 360 utilizes the INIT_CMD bus 342E to transmit a data request. PBC 340 uses the initial command bus group 342 as a communication interface with all master devices requesting memory data within IHS 300. Master devices generating data requests include the address or referenced address range of the data request within the initial command data request. The referenced address range may reference an address range in system memory 355.

In the disclosed embodiment, memory controller 350 is not a master device and does not generate an initial command or data request therein. Each master device of IHS 300 may initiate a data request by generating a respective initial command signal on a respective initial command bus. Master devices send initial commands on the initial command bus group 342 to PBC 340 for interpretation and processing.

PBC 340 receives and collects all data requests as initial commands from the master devices of IHS 300. PBC 340 determines if the next data request to process is a data request to a slave I/O device or a data request from a master I/O device, as per decision block 420. PBC 340 interprets the data request or initial command communication address range to determine the memory location of the data within IHS 300. If the data request is to a slave I/O device or from a master I/O device, then PBC 340 modifies the data request as "non-cacheable", as per block 425. Another term for non-cacheable, is "no intent to cache" by the requesting master device. Non-cacheable refers to any data request from a master device for which PBC 340 determines the data is not valid for caching in any cache within IHS 300.

After the data request modification of step 425, or if the data request is not to a slave I/O or from a master I/O device, PBC 340 collects all master data requests and selects the next data request for processing, as per block 430. A significant aspect of cache coherency protocols as shown in this embodiment is the ability of IHS 300 to manage multiple data requests for information from the same address location. For example while one master device, such as processor A 310 sends data to system memory 355 at a particular address, processor B 320 may request the same data from that same particular address location. The enhanced cache coherency protocol method as described in FIG. 4 demonstrates one methodology to avoid such potential cache conflicts in the example of IHS 300. A data request from any master device in IHS 300 that is pending completion is an "in flight" data request. PBC 340 blocks the data request per step 430 if another data request "in flight" has the same address, as per block 435.

PBC 340 sends a reflected command on the reflected command 344 bus group, as per block 440. More specifically, PBC 340 sends the reflected command to each snoop device of IHS 300. Each device of IHS 300 that resides on a reflected command bus, namely reflected command bus group 344, is a snoop device or snooper. Snoop devices may be master devices or other devices within IHS 300 that monitor the address range of a particular data request by any other master device. If that particular data request includes a reference to an address range that matches an address range within the local cache of the snoop device receiving the reflected command, cache coherency protocols require the snoop device to respond with information about the snoop device's particular memory data. Stated alternatively, PBC 340 sends a copy of the request from a master device for particular data to all devices within IHS 300 that may contain or manage that particular data. In more detail, PBC 340 sends the reflected command to processor A 310 on the REF_CMD bus 344A. PBC 340 sends the reflected command to processor B 320 on the REF_CMD bus 344B, and to processor C 330 on the REF_CMD bus 344C. PBC 340 sends the reflected command to memory controller 350 on the REF_CMD bus 344D and to slave I/O device controller 370 on the REF_CMD bus 344F.

Each device of IHS 300 that receives the reflected command on a respective reflected command 344 bus group is a snoop device, Each snoop device interprets the data request that processor bus controller 340 reflects and responds with a partial response, as per block 450. A snoop device within IHS 300 responds to a reflected command from PBC 340 with a partial response. For example, a snoop device such as processor A 310 responds to a reflected command from PBC 340 with a partial response communication on the PART_RESP bus 346A. A snoop device such as processor B 320 responds to a reflected command from PBC 340 with a partial response communication on the PART_RESP bus 346B. A snoop device such as processor C 330 responds to a reflected command from PBC 340 with a partial response communication on the PART_RESP bus 346C. A snoop device such as memory controller 350 responds to a reflected command from PBC 340 with a partial response communication on the PART_RESP bus 346D. A snoop device such as slave I/O device controller 370 responds to a reflected command from PBC 340 with a partial response communication on the PART_RESP bus 346F.

In one embodiment, master devices handle all data requests to slave I/O devices as non-cacheable. In one embodiment, PBC 340 ensures that the combined response for all data requests to slave I/O devices is dependent only on the partial response of the slave I/O device itself. For example, this allows slave I/O device controller 370 to assume that the combined response is the same as the partial response that slave I/O device controller 370 provides to PBC 340. With these conditions met, slave I/O device controller 370 or any other slave I/O devices do not require a combined response bus. PBC 340 can determine which devices are slave I/O devices by hardware strapping techniques, software device addressing data, or other hardware or software techniques. The partial response from any slave I/O device may include a decode signal that a particular slave I/O device asserts when the address of a data request matches the particular slave I/O memory data address range. PBC 340 may compare the decode signal from a known list of slave I/O devices. If the decode signal matches a slave I/O device of IHS 300, then PBC 340 blocks the partial responses from all other devices.

Each partial response from a snoop device to the PBC 340 on the partial response bus group 346 may take the form of multiple response types. One type of a partial response from a specific snoop device within IHS 300 is a "retry response". A retry response instructs PBC 340 to resend the reflected command signal again to that specific snoop device. Such a retry response from the specific snoop device may instruct the process bus controller 340 that the specific snoop device is busy and cannot respond currently.

A snoop device retry response may be the result of multiple conditions, such as waiting for data to settle, data bus busy, or other reasons. Another retry response type from a snoop device may be an "acknowledge" response. Upon receiving an acknowledge response, PBC 340 interprets that response as an allowable retry from the snoop device sending that response. The sending snoop device has the data in cache in a state that does not conflict with the data request, thus returning an acknowledge response to allow the data request transaction to proceed.

Snoop devices may include a decode signal with the partial response communication. PBC 340 receives partial response communications along with any decode signal information. PBC 340 tests to determine if the decode signal is from a slave I/O device such as slave I/O device 375, as per decision block 460. If the test determines that the decode signal is from a slave I/O device, then PBC 340 gates off or blocks partial responses from all other devices of IHS 300, as per block 465. However if the test determines that the decode signal is not from a slave I/O device, then PBC 340 combines all partial responses, as per block 470.

To maintain cache coherency, PBC 340 interprets each partial response from each snoop device and combines the responses into a special type of communication, namely a combined response. The combined response communication utilizes the combined response bus group 348. PBC 340 sends the combined response on the combined response 348 bus group, as per block 480. In response to receiving the combined response, master devices such as a master processor A 310 or master I/O device 365 perform local updates of their respective cache memories, as per block 485. The enhanced cache coherency protocol method ends at end block 490.

Snoop devices or other devices in IHS 300 that maintain memory data for sharing with other devices must also maintain an accurate representation of that memory data. Maintaining data integrity for cache memory data in a device such as processor A 310 is important for cache coherency. Cache memory such as L1 cache 315 and L2 cache 317 contain a copy of some other memory location in IHS 300. Any master device or device with cache memory in IHS 300 should maintain an accurate representation of data within their respective local caches. For example, processor A 310 monitors communications on the local cache coherency busses 345A, namely the INIT_CMD bus 342A, the REF_CMD bus 344A, the PART_RESP bus 346A, and the COMB_RESP bus 348A. Monitoring the data communications on the local cache coherency busses allows processor A 310 to maintain an accurate representation of the memory data within L1 cache 315 and L2 cache 317. If the L1 cache 315 contains a copy of particular memory data for which system memory 355 is the primary storage location, that particular memory data should be under cache coherency control.

Processor A 310 may monitor a communication of cache coherency busses 345A that indicates a change to particular data in system memory 355, thus rendering invalid a local copy of the particular data in L1 cache 315. Processor A 310 should thus modify that particular data location in L1 cache 315 as invalid. Subsequent requests for that particular data should indicate the invalid status of that particular data to any other device in IHS 300 that requests that particular data. During future operations of IHS 300, processor A 310 may update the particular data in L1 cache 315 and remove the invalid reference. In the same manner, other snoop devices of IHS 300 maintain their local cache memory store integrity.

Figure 5:
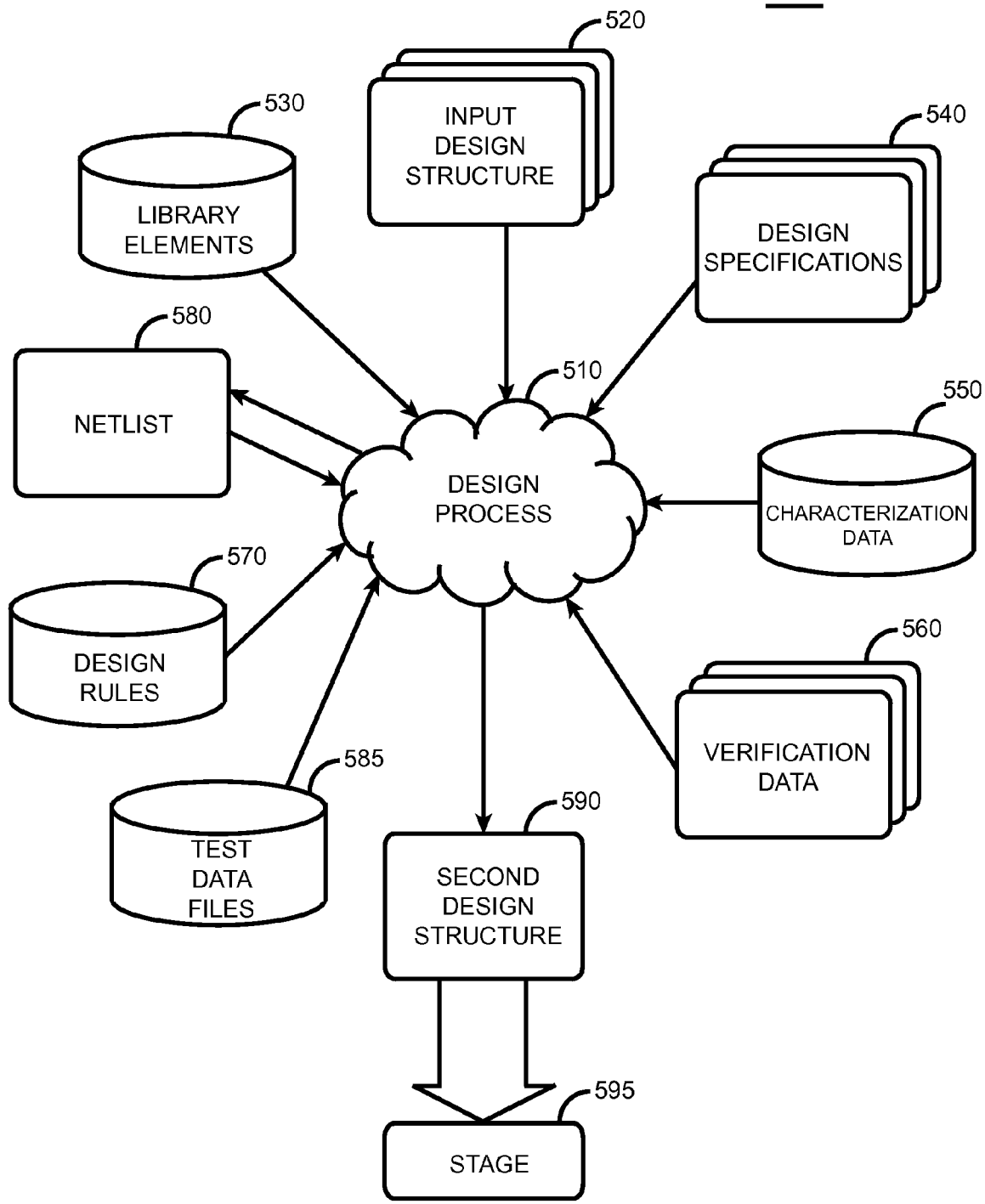
FIG. 5 shows a flow diagram of a design process used in semiconductor design, manufacture, and/or test of the IHS and processor IC of FIG. 3.

FIG. 5 shows a block diagram of an exemplary design flow 500 used for example, in semiconductor IC logic design, simulation, test, layout, and manufacture. Design flow 500 includes processes and mechanisms for processing design structures to generate logically or otherwise functionally equivalent representations of the embodiments of the invention shown in FIG. 3. The design structures processed and/or generated by design flow 500 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission or storage medium, design structure 520 may be accessed and processed by one or more hardware and/or software modules within design process 510 to simulate or otherwise functionally represent an electronic component, circuit, electronic or logic module, apparatus, device, or system such as those shown in FIG. 3. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIG. 3 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include modules for performing standard circuit design processes such as timing analysis, verification, design rule checking, place and route operations, etc.

Design process 510 employs and incorporates well-known logic and physical design tools such as HDL compilers and simulation model build tools to process design structure 520 together with some or all of the depicted supporting data structures to generate a second design structure 590. Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3. In one embodiment, design structure 590 may comprise a compiled, executable HDL simulation model that functionally simulates the devices shown in FIG. 3.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIG. 3. Design structure 590 may then proceed to a stage 595 where, for example, design structure 590: proceeds to tape-out, is released to manufacturing, is released to a mask house, is sent to another design house, is sent back to the customer, etc.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

I claim:

1. A design structure embodied in a nontransitory machine readable medium for designing, manufacturing, or testing a processor integrated circuit, the design structure comprising:
a plurality of master processor cores;
a plurality of cache memories, each cache memory being coupled to a respective master processor core; and
a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request the PBC sends a reflected command to any master processor core, system memory and I/O slave device that the PBC determines to be within the referenced address range;
wherein in response to the reflected command, the master processor cores, system memory and slave I/O device in the referenced address range, send respective partial responses to the PBC, the PBC receiving from the slave I/O device a signal that indicates that a particular partial response is a partial response from the slave device, such that the PBC blocks, in response to the signal, the partial response of the memory controller, the master processor cores, and the master I/O device but not the particular partial response of the slave I/O device from inclusion in a combined response that the PBC sends to master processor cores, master I/O devices and system memory, thus enabling the slave I/O controller coupled to the slave I/O device to assume that the combined response of the PBC to the particular partial response of the slave I/O device is the same as the particular partial response of the slave I/O device, such that the PBC need not actually send a combined response to the slave I/O device.

2. The design structure of claim 1, wherein the partial response of the slave I/O device includes a decode signal that indicates the slave I/O device is a slave I/O device.

3. The design structure of claim 1, wherein the plurality of master processor cores and the master I/O device controller are configured to receive the combined response.

4. The design structure of claim 3, wherein the master processor cores update their respective cache memories in response to the combined response.

5. The design structure of claim 3, wherein the master I/O device updates a memory of the master I/O device in response to the combined response.

6. The design structure of claim 1, wherein the PBC determines if an initial command data request is directed to a slave I/O device or from a master device that is a master I/O device, thus identifying an I/O request.

7. The design structure of claim 6, wherein the PBC designates the initial command data request as a non-cacheable request if the PBC determines that the initial command data request is identified as an I/O request.

8. The design structure of claim 1, wherein the partial response of at least one of the plurality of master processor cores, the memory controller and the slave I/O device controller is a retry response.

9. The design structure of claim 1, wherein the design structure is a netlist.

10. The design structure of claim 1, wherein the design structure resides on the storage medium as a data format used for the exchange of layout data of integrated circuits.

11. A hardware description language (HDL) design structure encoded on a nontransitory machine-readable data storage medium, said HDL design structure comprising elements that when processed in a computer-aided design system generates a machine-executable representation of a processor integrated circuit, wherein said HDL design structure comprises:
a first element processed to generate a functional computer-simulated representation of a plurality of master processor cores;
a second element processed to generate a functional computer-simulated representation of a plurality of cache memories, each cache memory being coupled to a respective master processor core; and
a third element processed to generate a functional computer-simulated representation of a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request the PBC sends a reflected command to any master processor core, system memory and I/O slave device that the PBC determines to be within the referenced address range;

wherein in response to the reflected command, the master processor cores, system memory and slave I/O device in the referenced address range, send respective partial responses to the PBC, the PBC receiving from the slave I/O device a signal that indicates that a particular partial response is a partial response from the slave device, such that the PBC blocks, in response to the signal, the partial response of the memory controller, the master processor cores, and the master I/O device but not the particular partial response of the slave I/O device from inclusion in a combined response that the PBC sends to master processor cores, master I/O devices and system memory, thus enabling the slave I/O controller coupled to the slave I/O device to assume that the combined response of the PBC to the particular partial response of the slave I/O device is the same as the particular partial response of the slave I/O device, such that the PBC need not actually send a combined response to the slave I/O device.

12. The HDL design structure of claim 11, wherein the partial response of the slave I/O device includes a decode signal that indicates the slave I/O device is a slave I/O device.

13. The HDL design structure of claim 11, wherein the plurality of master processor cores and the master I/O device controller are configured to receive the combined response.

14. The HDL design structure of claim 13, wherein the master processor cores update their respective cache memories in response to the combined response.

15. The HDL design structure of claim 13, wherein the master I/O device updates a memory of the master I/O device in response to the combined response.

16. The HDL design structure of claim 11, wherein the PBC determines if an initial command data request is directed to a slave I/O device or from a master device that is a master I/O device, thus identifying an I/O request.

17. The HDL design structure of claim 16, wherein the PBC designates the initial command data request as a non-cacheable request if the PBC determines that the initial command data request is identified as an I/O request.

18. The HDL design structure of claim 11, wherein the partial response of at least one of the plurality of master processor cores, the memory controller and the slave I/O device controller is a retry response.

19. The HDL design structure of claim 11, wherein the design structure is a netlist.

20. The HDL design structure of claim 11, wherein the design structure resides on the storage medium as a data format used for the exchange of layout data of integrated circuits.

21. A method in a computer-aided design system for generating a functional design model of a processor integrated circuit, the method comprising:
generating a functional computer-simulated representation of a plurality of master processor cores;
generating a functional computer-simulated representation of a plurality of cache memories, each cache memory being coupled to a respective master processor core; and
generating a functional computer-simulated representation of a processor bus controller (PBC) coupled to the plurality of master processor cores, the PBC being configured to couple to a system memory indirectly via a memory controller, the PBC being further configured to couple directly to a master I/O device controller and a slave I/O device controller, wherein the PBC receives an initial command data request from a master processor core or a master I/O device, the initial command data request including a referenced address range in the system memory, and in response to the initial command data request the PBC sends a reflected command to any master processor core, system memory and I/O slave device that the PBC determines to be within the referenced address range;

wherein in response to the reflected command, the master processor cores, system memory and slave I/O device in the referenced address range, send respective partial responses to the PBC, the PBC receiving from the slave I/O device a signal that indicates that a particular partial response is a partial response from the slave device, such that the PBC blocks, in response to the signal, the partial response of the memory controller, the master processor cores, and the master I/O device but not the particular partial response of the slave I/O device from inclusion in a combined response that the PBC sends to master processor cores, master I/O devices and system memory, thus enabling the slave I/O controller coupled to the slave I/O device to assume that the combined response of the PBC to the particular partial response of the slave I/O device is the same as the particular partial response of the slave I/O device, such that the PBC need not actually send a combined response to the slave I/O device.

22. The method of claim 21, wherein the partial response of the slave I/O device includes a decode signal that indicates the slave I/O device is a slave I/O device.

23. The method of claim 21, wherein the plurality of master processor cores and the master I/O device controller are configured to receive the combined response.

24. The method of claim 23, wherein the master processor cores update their respective cache memories in response to the combined response.

25. The method of claim 23, wherein the master I/O device updates a memory of the master I/O device in response to the combined response.

26. The method of claim 21, wherein the PBC determines if an initial command data request is directed to a slave I/O device or from a master device that is a master I/O device, thus identifying an I/O request.

27. The method of claim 26, wherein the PBC designates the initial command data request as a non-cacheable request if the PBC determines that the initial command data request is identified as an I/O request.

28. The method of claim 21, wherein the partial response of at least one of the plurality of master processor cores, the memory controller and the slave I/O device controller is a retry response.

29. The method of claim 21, wherein the design structure is a netlist.

30. The method of claim 21, wherein the design structure resides on the storage medium as a data format used for the exchange of layout data of integrated circuits.

* * * * *